United States Patent [19]

Hayes et al.

[11] Patent Number: 5,059,746
[45] Date of Patent: Oct. 22, 1991

[54] HOUSING ASSEMBLY FOR ELECTRONIC COMPONENTS

[75] Inventors: Earl J. Hayes, Mechanicsburg; Gary W. Hawk, Halifax, both of Pa.

[73] Assignee: AMP Incorporated, Harrisburg, Pa.

[21] Appl. No.: 345,497

[22] Filed: May 1, 1989

[51] Int. Cl.$^5$ .............................................. H05K 5/00
[52] U.S. Cl. .................................. 174/52.1; 174/52.2; 264/272.11; 439/403
[58] Field of Search ............... 174/52.1, 52.2, 50, 174/51; 336/96; 361/380; 338/256, 257; 439/402, 403; 264/272.11, 272.13-272.21

[56] References Cited

U.S. PATENT DOCUMENTS

| | | | |
|---|---|---|---|
| 3,118,715 | 1/1964 | Potruch | 439/402 |
| 3,735,209 | 5/1973 | Saddler | 174/52.2 X |
| 3,909,504 | 9/1975 | Browne | 174/52.2 |
| 4,158,745 | 6/1979 | Keller | 174/52 FP |
| 4,252,864 | 2/1981 | Coldren | 428/571 |
| 4,293,947 | 10/1981 | Brittain | 370/89 |
| 4,339,768 | 7/1982 | Keller et al. | 357/72 |
| 4,508,399 | 4/1985 | Dowling et al. | 339/17 CF |
| 4,603,320 | 9/1986 | Farago | 340/347 DD |
| 4,686,506 | 8/1987 | Farago | 340/347 DD |
| 4,699,445 | 10/1987 | Porta et al. | 439/698 |
| 4,752,247 | 6/1988 | Warnars | 439/684 |
| 4,822,299 | 4/1989 | Rider, Jr. | 439/402 |

*Primary Examiner*—Gerald P. Tolin
*Assistant Examiner*—David A. Tone
*Attorney, Agent, or Firm*—Robert W. Pitts; Allan B. Osborne

[57] ABSTRACT

Housing assembly for components, such as Hall effect sensors, comprises an inner housing of premolded relatively firm plastic material and an outer housing which is overmolded on the inner housing. The components are contained in cavities in the inner housing. Passageways extend through the inner housing to the cavities and the soft overmolded material flows through these passageways and forms a surrounding cushion within the cavities for the components. Also disclosed is a system for mounting proximity sensors on an automotive door lock or the like in a manner which detects the fully closed and the partially closed conditions of the door.

18 Claims, 11 Drawing Sheets

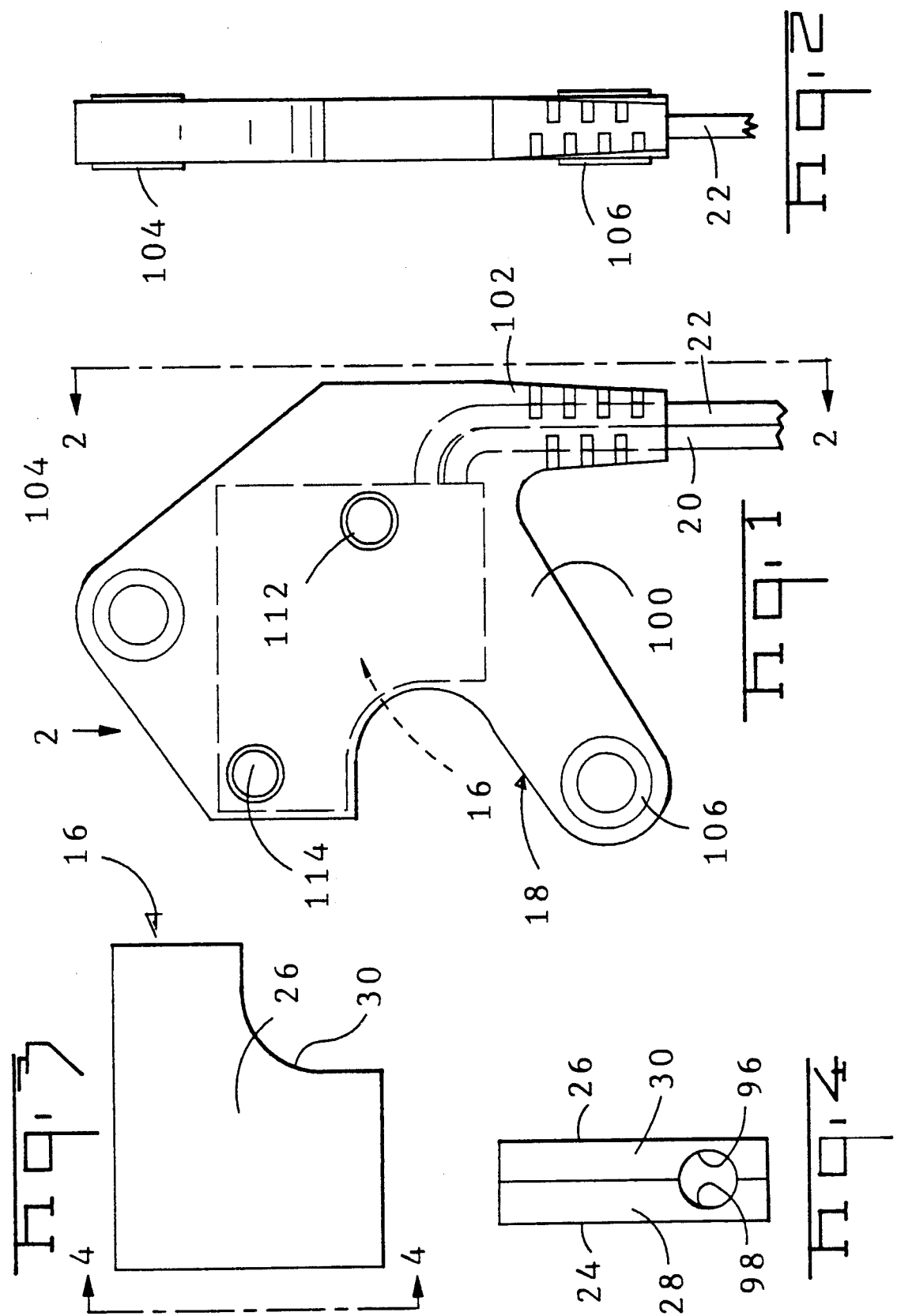

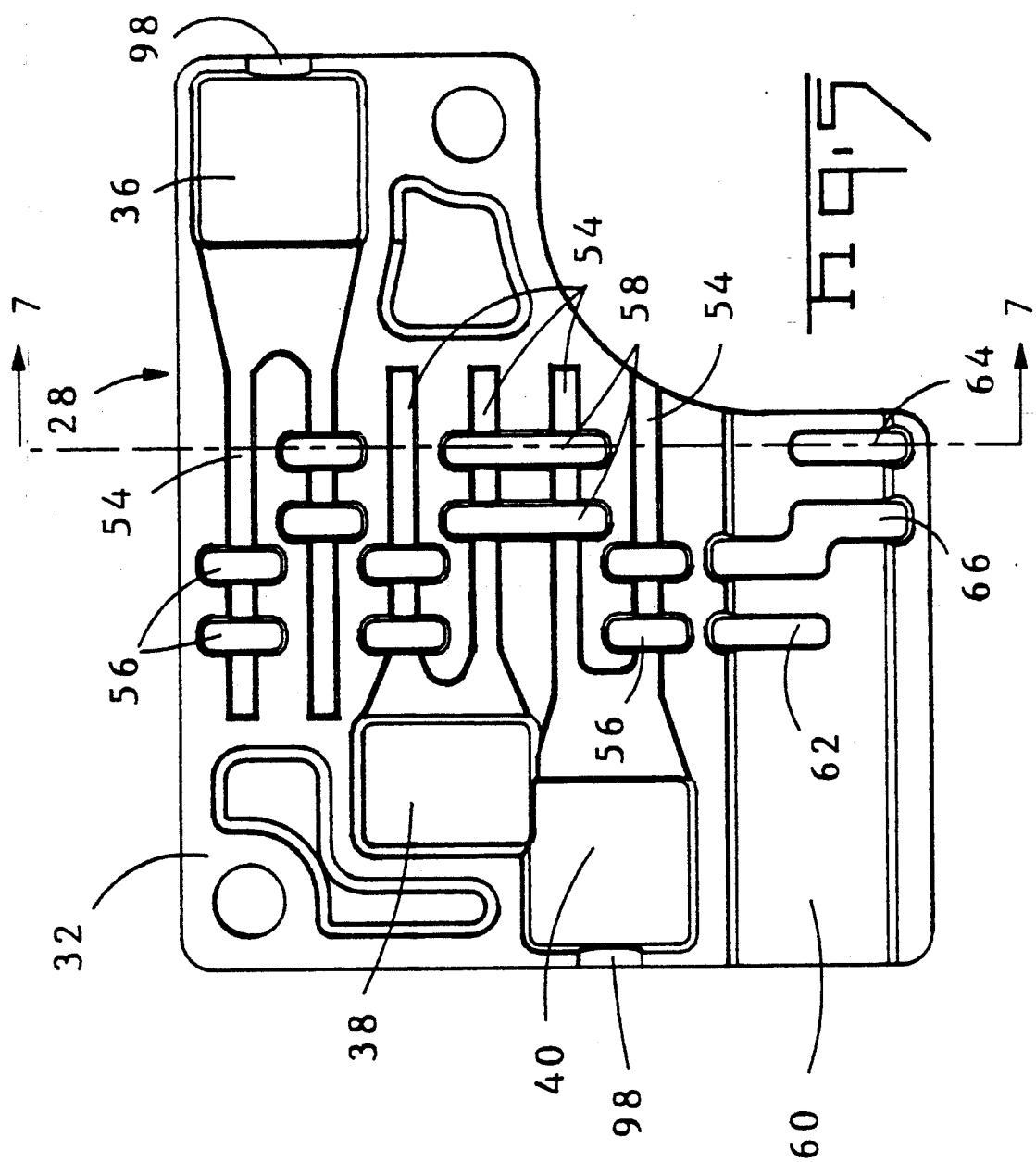
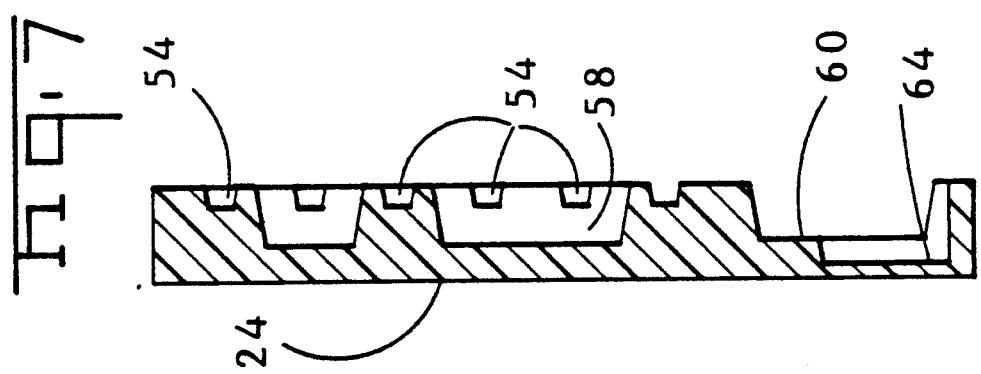

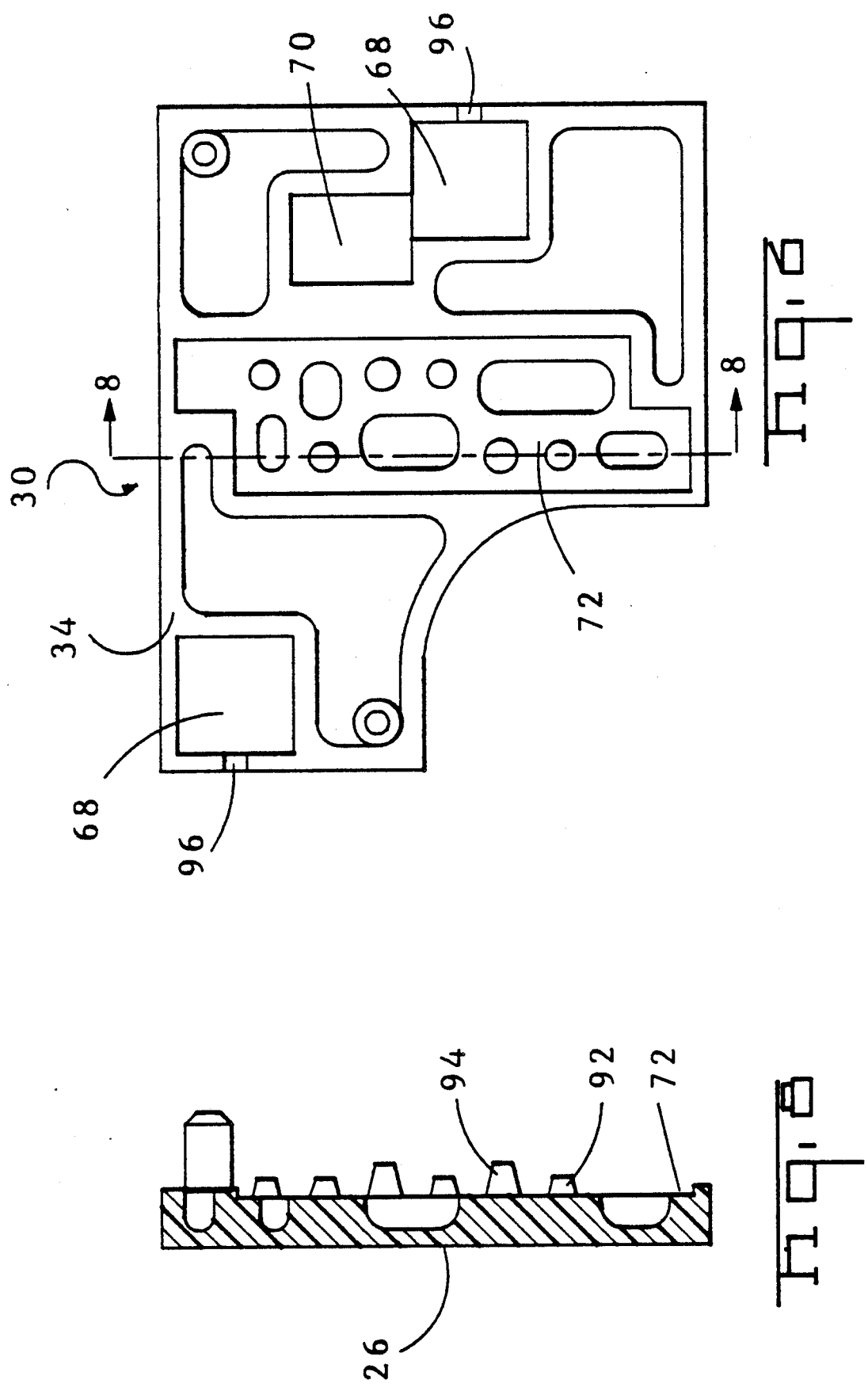

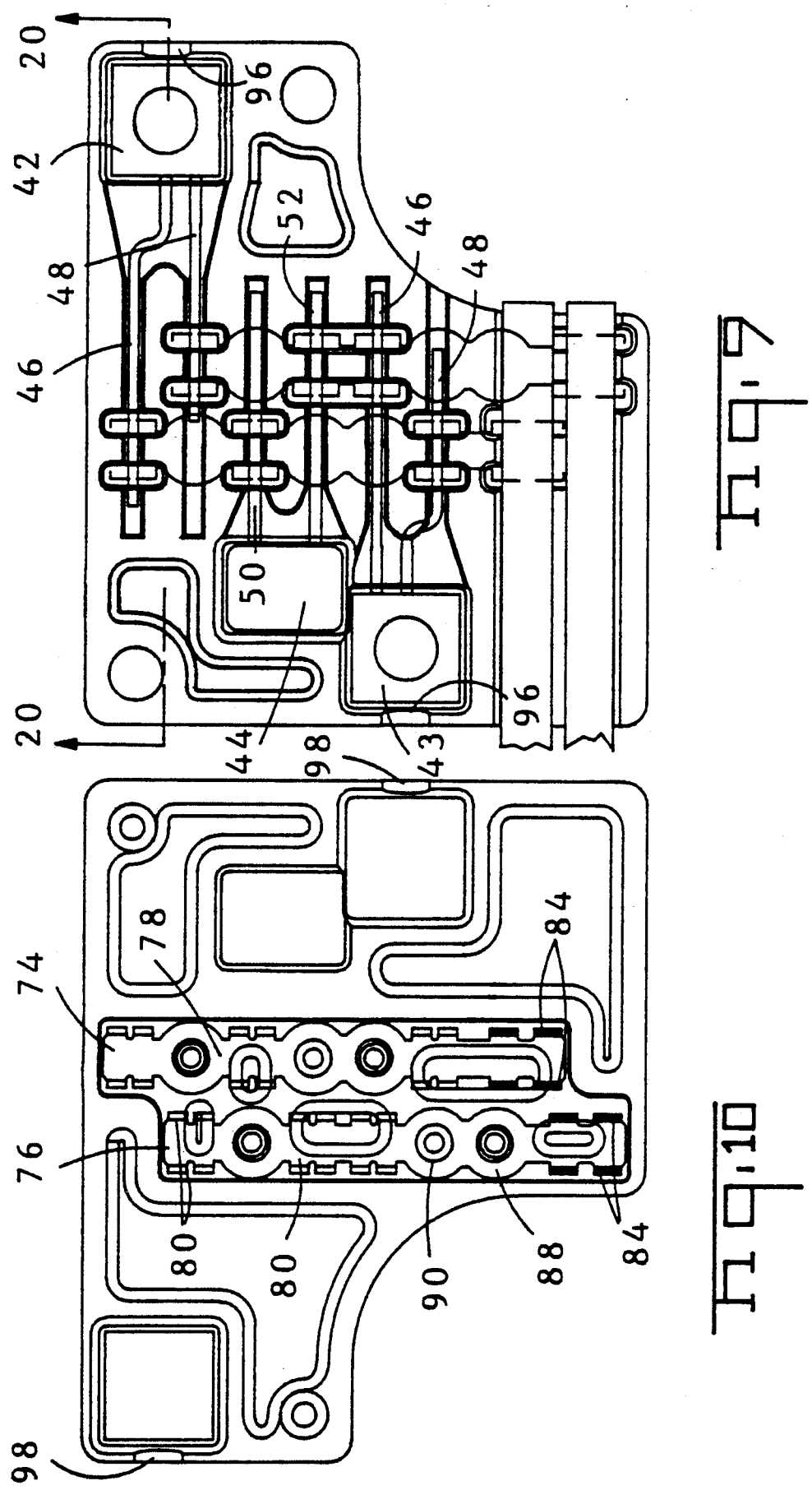

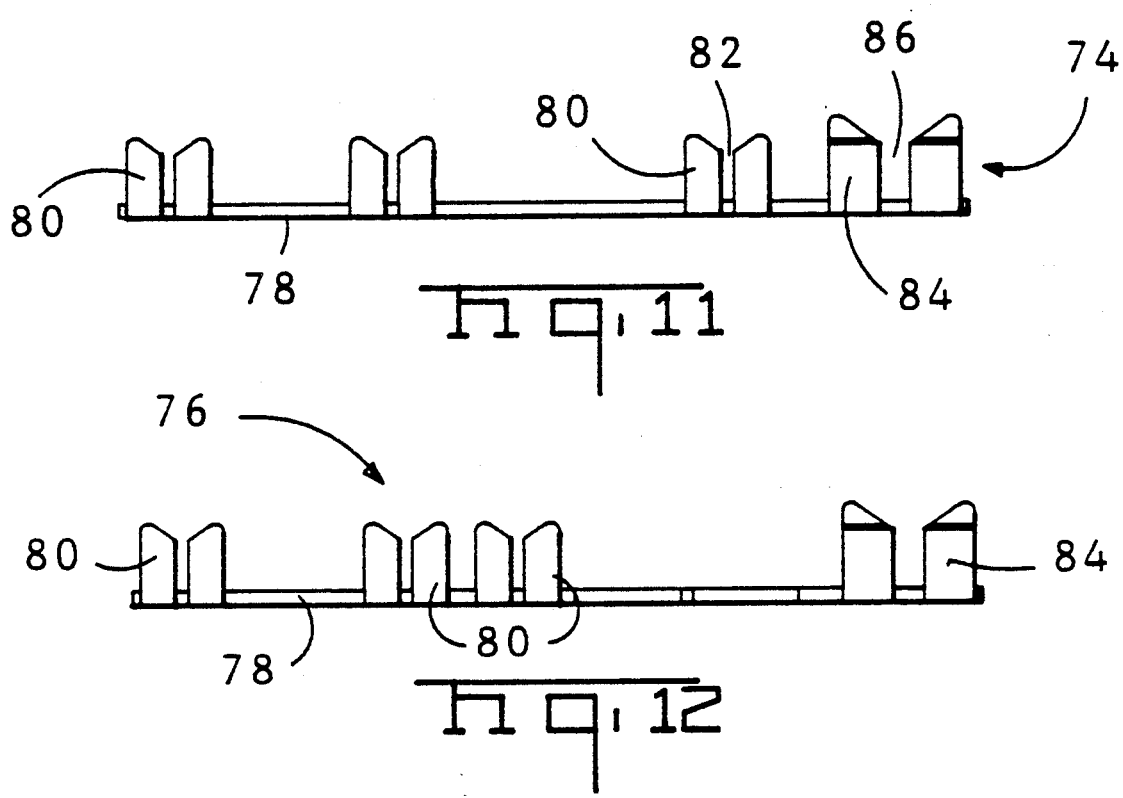
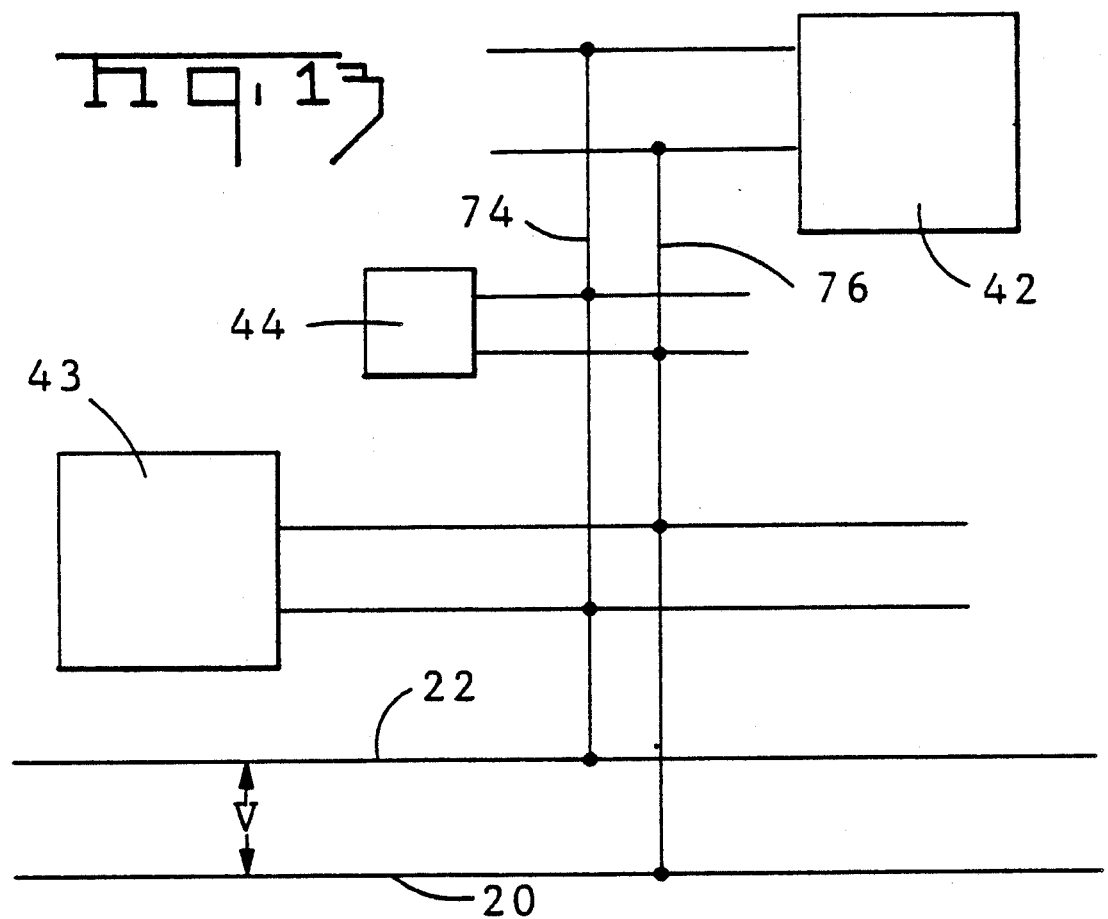

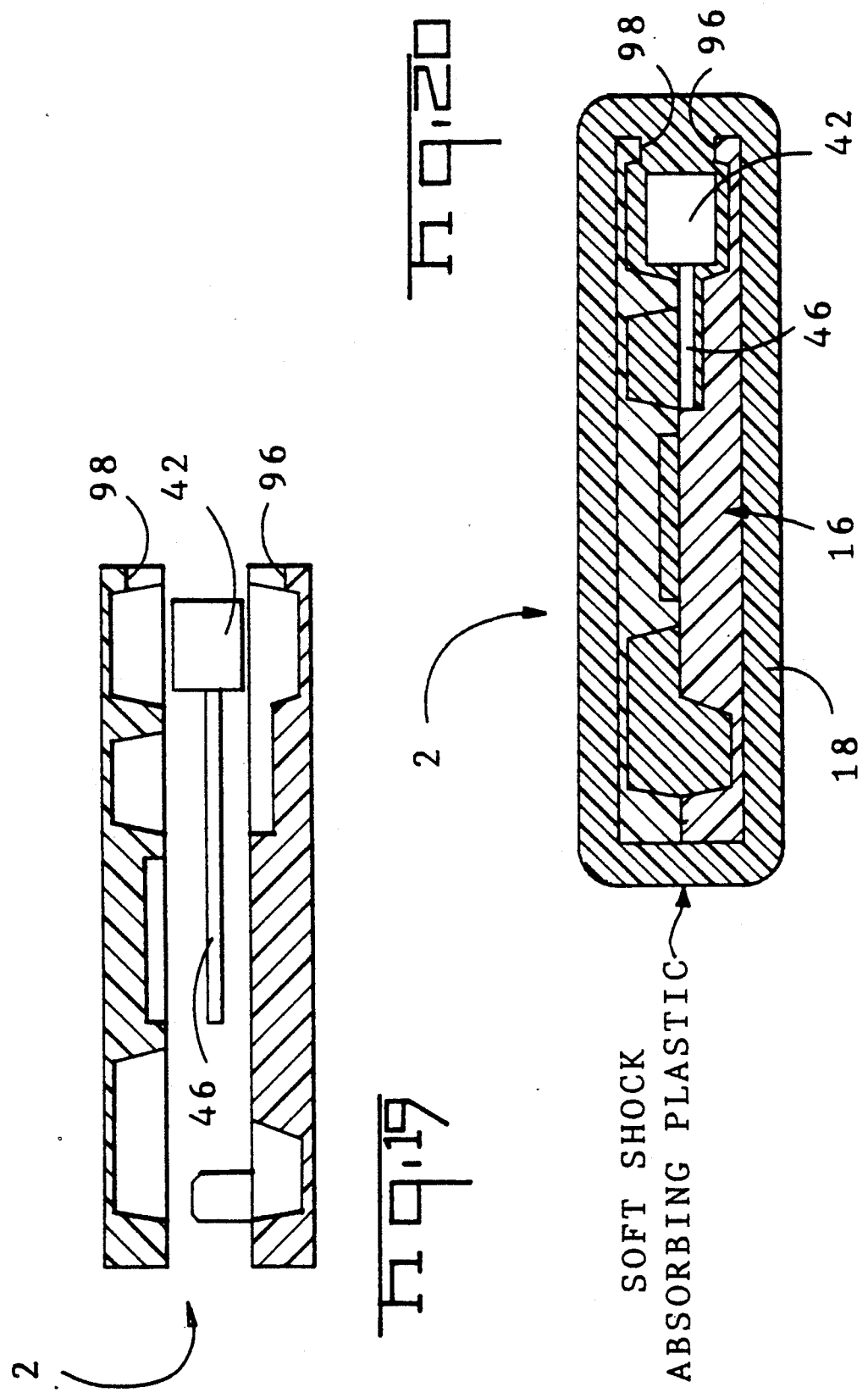

HOUSING ASSEMBLY FOR ELECTRONIC COMPONENTS

FIELD OF THE INVENTION

This invention relates to protective housings for electronic components such as proximity sensors and to the use of proximity sensors, such as Hall effect sensors, to detect the movement of parts such as the latch member in a vehicle door lock.

BACKGROUND OF THE INVENTION

Under some circumstances, it is desirable to provide protective housings or packaging for electronic components which seal the components against the atmosphere and which also protect the component against the effects of physical damage such as prolonged vibration or physical blows or shocks which might result from normal use of the parts on which the housing containing the component is mounted. For example, components are sometimes mounted in, or on, the door of a motor vehicle and the components are then subject to repeated shocks which are produced when the door is repeatedly closed. The mounting system must also protect the component from the atmosphere so that it will achieve its expected useful life. In accordance with one aspect thereof, the invention is directed to the achievement of an improved packaging system or housing assembly for components which is intended for use in an environment similar to that encountered on a vehicle door.

In accordance with a further aspect thereof, the invention is directed to the achievement of a system for using proximity sensors, such as Hall effect sensors, in a vehicle door to detect the condition of the door; that is, whether it is partially closed or fully and properly closed and latched. Heretofore, it has been customary to use a switch mounted on the door frame to detect the full and complete closure of the door so that the warning light will be energized when the door is not fully closed. Switches of this type are open when the door is fully closed and properly latched and are closed when the door is only partially closed so that a warning can be given to the operator of the vehicle. When the vehicle is provided with passive restraint devices (air bags or automatic seatbelts), it is desirable to provide a positive signal when the door is fully and properly closed and also to provide a signal when the door is only partially closed. The signal which is transmitted when the door is fully and completely latched is used to control the energizing circuits for the passive restraint device and the signal which is transmitted when the door is only partially closed is used to energize the warning signal for the driver. A simple switch is incapable of performing these functions but Hall sensors or the like are capable of doing so and thereby meet the requirements of vehicles equipped with passive restraints.

THE INVENTION

In accordance with one aspect thereof, the invention comprises a housing means containing an electrical device and is characterized in that the housing comprises an inner housing and an outer housing, the electrical device being in the inner housing and the outer housing being in enclosing relationship to the inner housing. The outer housing is of a soft deformable shock absorbing material and is overmolded on the inner housing so that the electrical device is protected from the imposition of shock from external forces by the inner housing and the inner housing is protected by the outer housing. Preferably, a passageway extends into the inner housing and communicates with the cavities in which the electrical device is contained so that when the outer housing material is molded on the inner housing, the material of the outer housing flows through the passageway and surrounds the device. The device is thereby contained within a soft, deformable, shock absorbing envelope which in turn is contained in a relatively hard inner housing of premolded material that is in turn protected against vibration or shock or the like by the soft outer housing material.

In accordance with a further embodiment, the invention comprises a door lock assembly which is intended for use in a motor vehicle door or the like. The lock assembly comprises a lock housing having a side plate which has an external surface and an internal surface, the external surface being adjacent to one surface of the door after installation of the lock thereon. A latch member is contained in the lock housing which is proximate to the internal surface of the side plate and which is movable in a plane parallel to the side plate between first and second positions. The door lock assembly is characterized in that sensing means are provided on the door lock assembly for sensing the position of the latch member. The sensing means comprises a proximity sensor and a proximity exciter. The proximity exciter is on the latch member and the sensor is in a fixed position which is adjacent to the side plate of the lock housing. The proximity exciter is adjacent to the sensor when the latch member is in one of the first and second positions respectively. The proximity sensor is preferably a Hall effect sensor and the exciter is a magnet which is mounted on the latch member, the sensor being mounted on the lock housing adjacent to the face plate thereof. In one embodiment, two proximity sensors are provided, the first sensor being in a first fixed position and the second sensor being in a second fixed position. The exciter is adjacent to the first sensor when the latch member is in its first position and is adjacent to the second sensor when the latch member is in its second position. The sensors may be contained in a protective housing comprising inner and outer housings as described above in order to protect the sensors from the effects of repeated door openings and closings.

THE DRAWING FIGURES

FIG. 1 is a plan view of a housing assembly in accordance with the invention.

FIG. 2 is a side view looking in the direction of the arrows 2—2 of FIG. 1.

FIG. 3 is a plan view of the inner housing assembly which is contained in the outer housing shown in FIG. 1.

FIG. 4 is an end view looking in the direction of the arrows 4—4 of FIG. 3.

FIG. 5 is a plan view showing the internal surface of one part of the inner housing and showing the component receiving cavities therein.

FIG. 6 is a view similar to FIG. 5 showing the internal surface and cavities in the second part of the inner housing.

FIGS. 7 and 8 are views looking in the direction of the arrows 7—7 and 8—8 of FIGS. 5 and 6 respectively.

FIGS. 9 and 10 are views similar to FIGS. 5 and 6 but showing the components, the external conductors, and the sheet metal connecting devices positioned in the two housing parts.

FIGS. 11 and 12 are side views showing the sheet metal connecting devices which are used to connect the component leads to the external leads.

FIG. 13 is a wiring diagram showing the connections between the components and the external leads.

Figure 14:
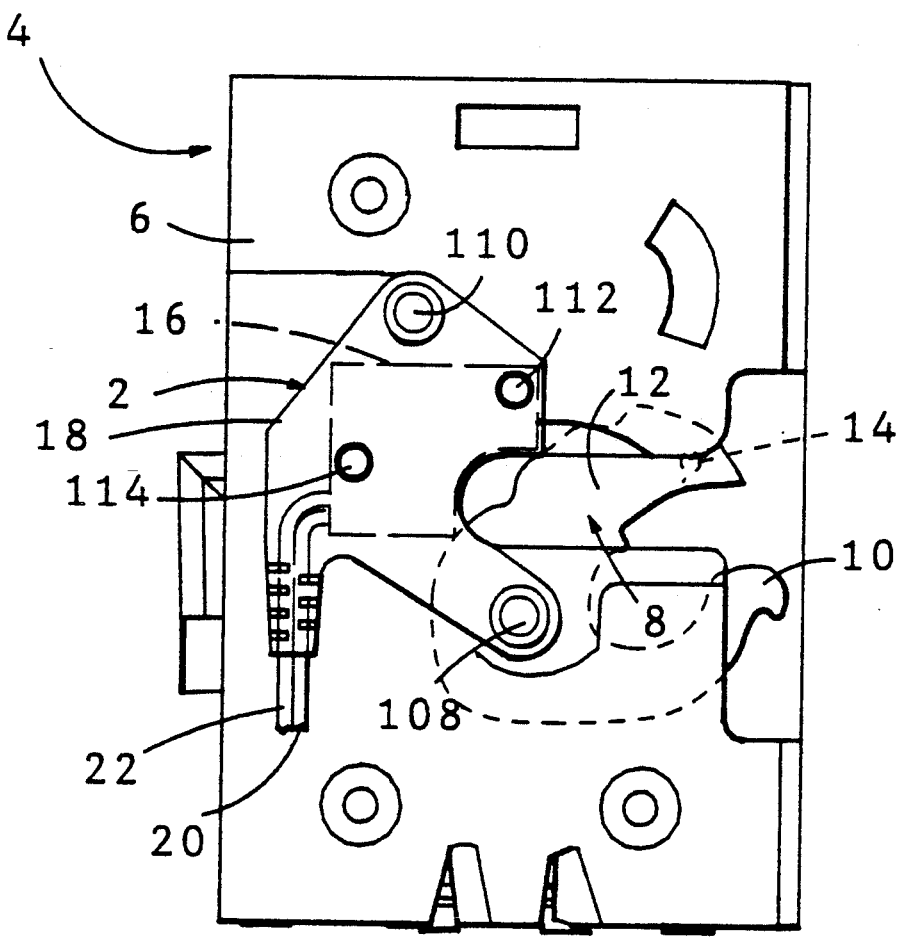
Figure 15:
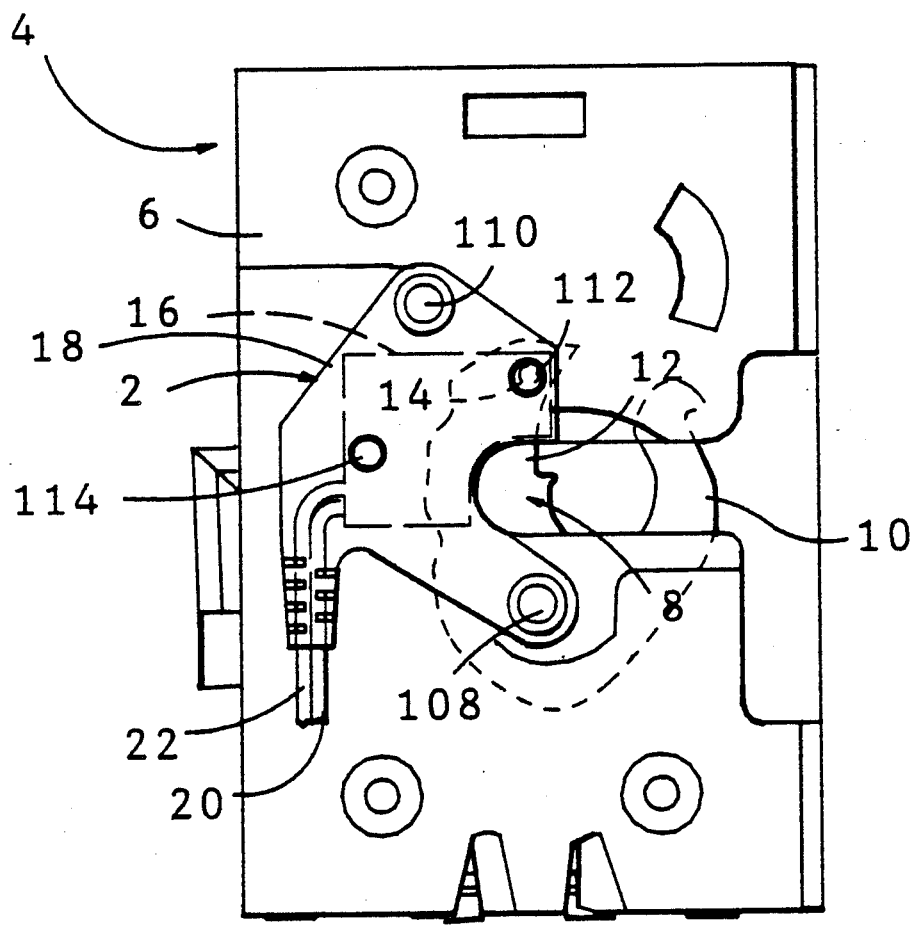
Figure 16:
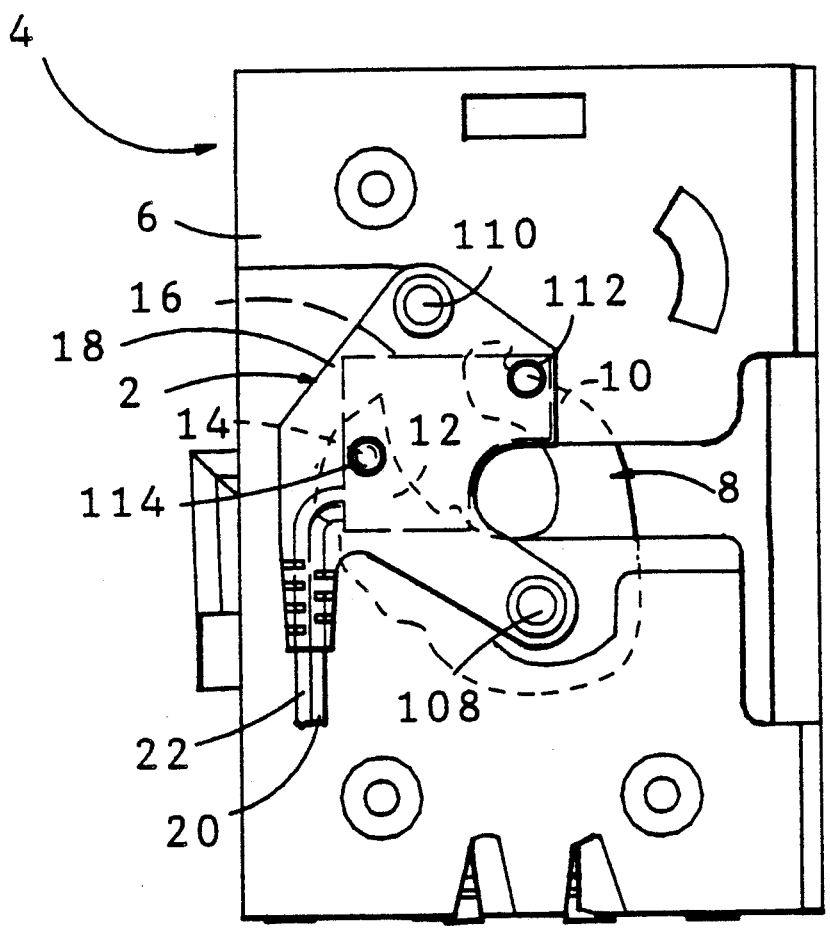

FIGS. 14, 15, and 16 are plan views of one side of a door lock housing showing the several positions of the latch member and illustrating the manner in which the component housing assembly is mounted on the face plate of the lock housing.

Figure 17:
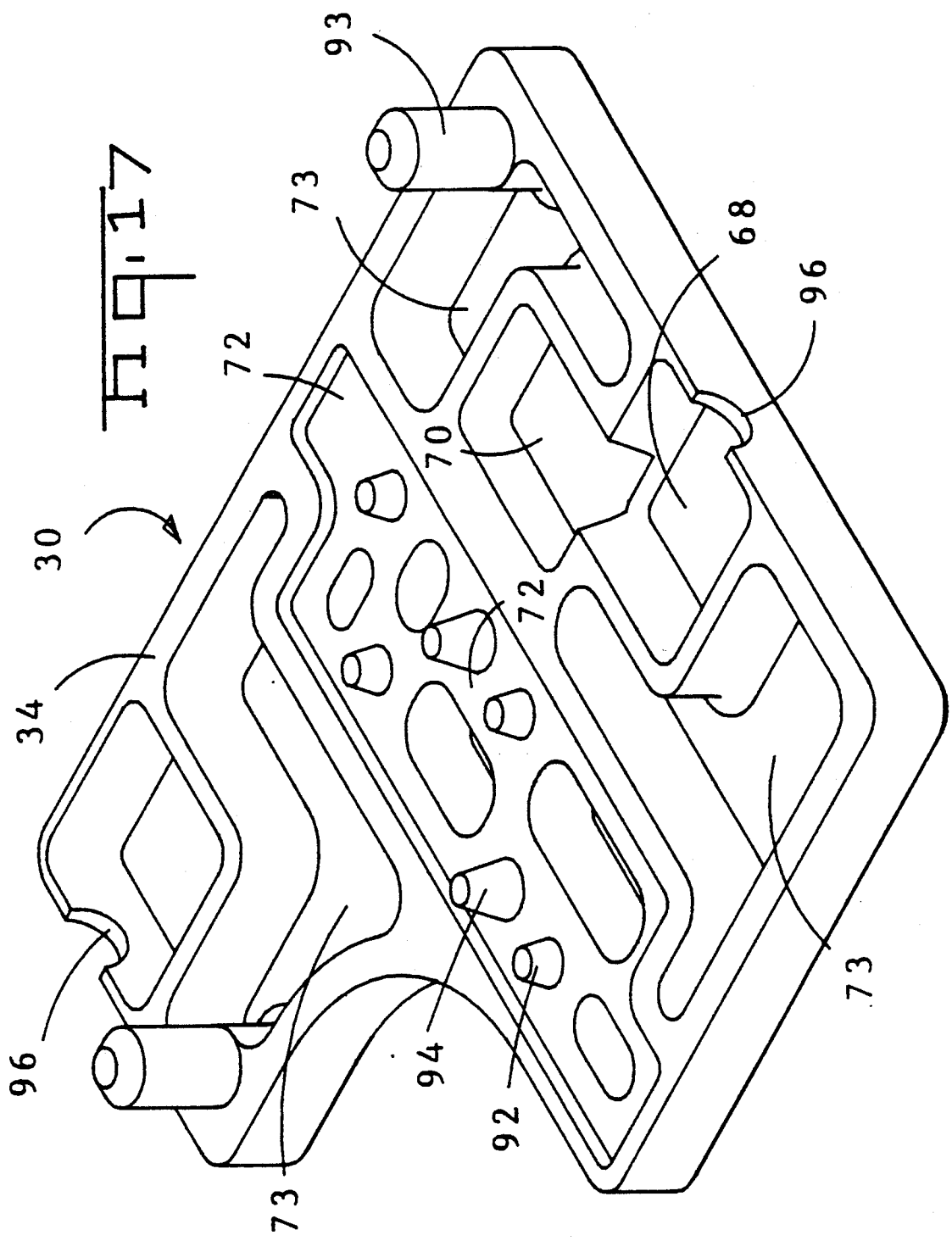
Figure 16:
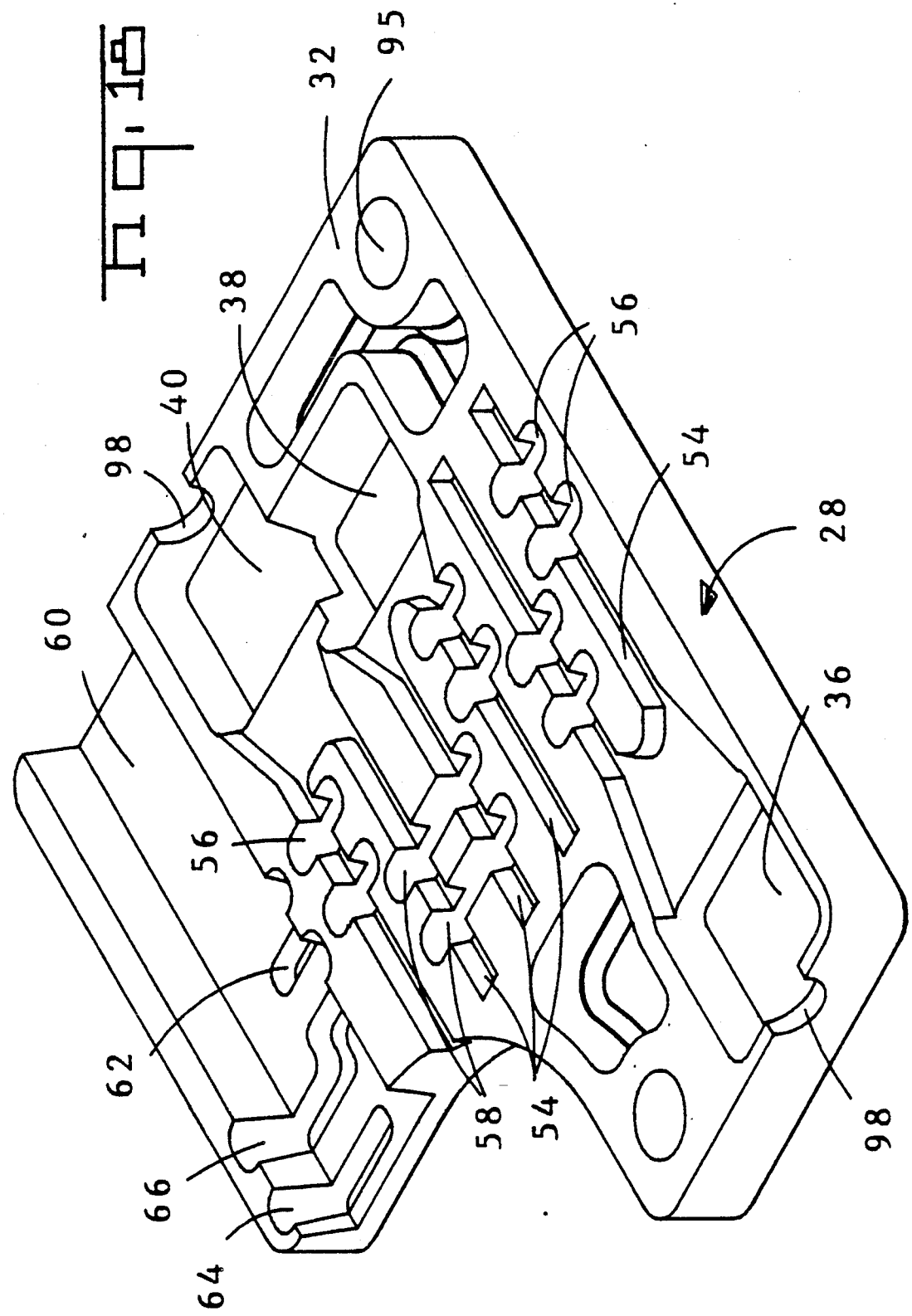

FIG. 17 is a perspective view of the inner housing part shown in FIG. 5.

FIG. 18 is a perspective view of the inner housing part shown in FIG. 6.

FIG. 19 is a semi-diagrammatic sectional side view showing the two inner housing parts in opposed aligned relationship with a component exploded from the housing parts.

FIG. 20 is a semi-diagrammatic sectional side view of the inner housing illustrating the manner in which the outer housing material surrounds the components contained in the inner housing.

THE DISCLOSED EMBODIMENT

A housing assembly 2 in accordance with the invention is intended for mounting on the face plate 6 of a door lock assembly 4 (FIG. 14). The door lock assembly has a plastic latch member 8 pivotally mounted on a pivotal axis 108 adjacent to the rearward side of the plate 6. The latch member has spaced-apart arcuately extending latch arms 10, 12. A magnet 14 is mounted on the plastic latch arm 12 and functions as an exciter for proximity sensors contained in the housing assembly 2.

The housing assembly comprises an inner housing 16 and an outer housing 18 which is overmolded on the inner housing. External leads 20, 22 extend through a neck portion 102 of the outer housing to the inner housing and are connected to components contained in the inner housing.

The inner housing 16, FIGS. 3–12, has oppositely facing major external surfaces 24, 26 and is composed of first and second premolded parts 28, 30. These premolded parts have first and second internal surfaces 32, 34 which are bonded or otherwise secured to each other in a medial plane which is substantially midway between the external surfaces 24, 26. First cavity means 36, 38, 40 extend into the first internal surface of the first part 28. The cavities 36, 40 contain first and second proximity sensors 42, 43 preferably Hall effect sensors, and the cavity 38 contains a capacitor 44. The Hall effect sensors have parallel leads 46, 48 and the capacitor has parallel lead wires 50, 52. Channel-like lead receiving cavities 54 extend from the component receiving cavities 36, 38, 40 and are considerably more shallow than are the component cavities as shown in FIG. 7. Additionally, transverse recesses 56, 58 extend into the first internal surfaces and intersect the lead receiving cavities 54. These recesses are provided for the reception of ears on sheet metal connecting devices described below and connect the lead wires in accordance with the circuit diagram shown in FIG. 13 to the external leads 20, 22. The external leads are received in a cavity in the form of a passageway 60 and recesses 62, 64, 66 intersect this passageway as shown in FIG. 5. These recesses also receive ears extending from the connecting devices shown in FIGS. 10–12.

The second part 30 of the inner housing has relatively shallow cavities 68, 70 for the projecting portions of the sensors and the capacitor. In addition, a shallow recess 72 is provided for two sheet metal connecting devices, 74, 76 shown in FIGS. 10–12. These connecting devices are similar to each other but are not identical in order that the selective connections to the lead wires 46, 48, 50, 52 and the external leads 20, 22 will be made as shown in FIG. 13.

Shallow recesses as shown at 73 are provided in the surfaces 32, 34 as required by good molding practice. These recesses reduce the amount of plastic material required and facilitate the molding process in that they reduce the amount of time required for the molding material to solidify after it is injected into the mold cavity. Integral pins 93 and blind holes 95, dimensioned to receive the pins, can be provided for alignment purposes and as an aid in securing the inner housing parts to each other.

Each of the sheet metal connecting devices has an elongated web 78 and has aligned pairs of ears 80, 84 extending from the side edges thereof, see FIG. 10. The pairs of ears 80 have relatively narrow slots 82 extending inwardly from their outer edges which are dimensioned to receive the component leads 46–52. The pairs of ears 84 are designed to receive the relatively heavier gauge external leads 20, 22 and have slots 86 which will contact the conducting cores of these insulated leads when the external leads move relatively into these slots 86. The pairs of ears on the sheet metal connecting devices are separated by rings 88 that are integral with the adjacent web portions and these rings have circular holes 90 therein. Short and relatively high bosses 92, 94 extend from the floor of the recess 72. The bosses 94 are received selectively in the holes 90 in the rings so that the bosses will retain the connecting devices in assembled relationship to the housing part 30. The bosses can be heat-staked onto the connecting devices or an interference fit can be relied upon to retain the connecting devices on the housing part 30. The relatively short bosses 92 are positioned such that they enter the lead receiving recesses 54 and clamp the component leads in their respective lead receiving recesses.

Passageways in the form of opposed channels 96, 98 in opposed surfaces 32, 34 extend inwardly from the external surfaces of the two parts of the inner housing and communicate with the component receiving cavities. These passageways permit the plastic material used in the overmolding process, in which the outer housing is formed, to flow into the component receiving cavities 68, 70, and into the channel-like lead receiving cavities as shown in FIG. 20.

When the overmolding process is carried out, the assembled inner housing is placed in a mold and functions as an insert of a conventional insert molding process. Bushings 104, 106 are also insert molded into the completed assembly 2 at locations such that the pivotal axis 108 of the latch arm 8 and a fastener 110 which extends into the face plate 6 can be used to secure the housing assembly 2 against the face plate as shown in FIG. 15.

The locations of the magnet 14 in the latch arm 8 at the two detected stages or conditions of the latch arm are indicated in the assembly 2 by depressions 112, 114. These depressions are not essential but are simply provided to give a visual indication of the locations of the Hall effect sensors in the housing assembly.

The sensing mechanism operates as follows. When the door is fully closed and properly latched, the parts will be in the positions of FIG. 16 and the exciter will be immediately adjacent to the Hall effect sensor 43 which is in the cavity 40. When the door is closed but not properly latched and the parts are in the positions of FIG. 15, the exciter will be immediately adjacent to the sensor 42 which is in the cavity 36. When the door is open and the parts are in the position of FIG. 14, the exciter will be spaced from both of the sensors. No signal will be transmitted when the door is open and signals will be transmitted when the door is partially and improperly closed and when the door is fully and properly closed. The signals transmitted in the latter two instances (fully closed and partially closed) can be distinguished from each other and the warning light for a partially closed door can be energized or the circuits can be closed to energize the passive restraint device in the vehicle.

The completed assembly 2 is produced by providing the two inner housing parts as premolded parts of a relatively firm nondeformable plastic material. The Hall effect sensors, the capacitor, the external leads, and the sheet metal connecting devices are then placed in the parts as shown in FIGS. 9 and 10. The two plastic parts are then assembled to each other and secured to each other either by bonding or by heat-staking. When the second part is assembled to the first part, the appropriate pairs of ears 80, 84 on the connecting devices 74, 76 will enter the appropriately located recesses 56, 58, 62, 64, 66 in the first part and establish electrical contact as shown in FIG. 13 between the component leads and the external leads. Thereafter, the outer housing is overmolded on the inner housing as explained above. The components 42, 43, 44 will be spaced from the walls of the cavities 36, 38 and from the shallow depressions in the second housing part 30. The relatively soft shock absorbing material of the outer housing is thus permitted to flow through the passageways and into the cavities and will surround the components forming a cushion between the external surfaces of the components and the walls of the cavities. The soft material will also flow, to some extent at least, into the channels 54 which receive the component leads and seal the electrical connections formed between the leads and the slotted ears of the connecting devices. The inner and outer housing can be of any suitable plastic material such as a polyvinylchloride or a thermoplastic rubber. The inner housing should be relatively hard so that it will be capable of pushing the wires into the wire-receiving slots when the two inner housing parts are assembled to each other as explained above.

From the foregoing description it will be seen that the invention discloses an effective method of packaging electronic components in a manner such that they are sealed from atmospheric conditions and are also protected against damage as a result of vibration or impact. Additionally, the invention discloses an effective method of mounting proximity sensors on a door lock assembly in a manner such that the fully closed condition of the door is detected by a positive signal as well as the partially latched position of the door.

We claim:

1. A housing means containing electrical device means comprises a premolded inner housing of a relatively firm plastics material and an outer housing of a relatively softer deformable shock absorbing material, the electrical device means being in a cavity in the inner housing, the outer housing being in enclosing relationship to the inner housing, the outer housing being overmolded on the inner housing with said softer material flowing through an opening into said cavity during said overmolding whereby, the electrical device means is at least partially surrounded by said softer material and protected from the imposition of external forces by said softer material and by the inner housing and the inner housing is protected by the outer housing.

2. A housing means as set forth in claim 1 characterized in that external lead means are provided, the external lead means extending into, and through, the outer housing and into the inner housing, the external lead means being connected to the electrical device means.

3. A housing means as set forth in claim 2 characterized in that the electrical device means comprises an electrical component having component lead means extending therefrom, the component lead means being electrically connected to the external lead means by sheet metal connecting means having wire receiving slots therein, the component lead means and the external lead means being received in the wire receiving slots.

4. A housing means as set forth in claim 1 characterized in that external lead means are provided which extend into, and through, the outer housing and into the inner housing, the electrical device means comprising an electrical component having component lead means extending therefrom, the component lead means being connected to the external lead means by sheet metal connecting means having wire receiving slots, the external lead means and the component lead means being received in the wire receiving slots.

5. A housing means as set forth in claim 4 characterized in that the inner housing has oppositely facing major external surfaces and comprises first and second premolded housing parts, the first and second parts having first and second major internal surfaces respectively, the major internal surfaces being against each other in a medial plane which is between the major external surfaces, the cavity means comprising first and second cavity means, the first cavity means extending inwardly from the first internal surface, the external leads, the component, and the component leads being in the first cavity means, the second cavity means extending inwardly from the second internal surface, the sheet metal connecting means being in the second cavity means.

6. A housing means as set forth in claim 5 characterized in that the component has two component leads extending therefrom and two external leads extending into the housing, the sheet metal connecting means comprising two connecting devices, one of the connecting devices having lead receiving slots in which one of the component leads and one of the external leads are received, the other connecting device having lead receiving slots in which the other component lead and the other external lead are received.

7. A housing means as set forth in claim 6 characterized in that the first cavity means comprises a component cavity in which the component is positioned, and two channel-like component lead cavities are provided in which the component leads are received, and external lead cavities are provided in which the external leads are positioned.

8. A housing means as set forth in claim 7 characterized in that a plurality of components are contained in the inner housing, each component having two component leads extending therefrom, each of the sheet metal connecting devices having a plurality of lead receiving slots in which a component lead of one of the components is received.

9. A housing means as ret forth in claim 8 characterized in that the housing means is intended for mounting on a vehicle door lock assembly, two of the components being proximity sensors for sensing the location of a movable part in the door lock assembly, and mounting means are provided for mounting the housing means on the door lock assembly.

10. An assembly comprising insulating inner and outer housings, the inner housing being of relatively hard plastic material and having an electrical component therein, the component having component leads, and external leads extending into the housing, the external leads being electrically connected to the component leads, the assembly being characterized in that:

the inner housing has oppositely facing major external surfaces and comprises first and second premolded housing parts, the first and second parts having first and second major internal surfaces respectively, the major internal surfaces being against each other in a medial plane which is between the major external surfaces, the first housing part having first cavity means therein extending inwardly from the first internal surface, the external leads, the component, and the component leads being in the first cavity means, the second housing part having second cavity means extending inwardly from the second internal surface, and sheet metal connecting means are provided in the second cavity means, the sheet metal connecting means having lead receiving slots, the component leads and the external leads being received in the slots thereby connecting the component leads to the external leads, said outer housing being of relatively soft deformable material and being overmolded on the inner housing with the softer deformable material flowing into said first and second cavity means through passageway means thereinto whereby the component leads, the external leads and the sheet metal connecting means are surrounded and protected by the soft deformable material.

11. An assembly as set forth in claim 10 characterized in that the component has two component leads extending therefrom and two external leads extend into the housing, the sheet metal connecting means comprising two connecting devices, one of the connecting devices having lead receiving slots in which one of the component leads and one of the external leads are received, the other connecting device having lead receiving slots in which the other component lead and the other external lead are received.

12. An assembly as set forth in claim 11 characterized in that the first cavity means comprises a component cavity in which the component is positioned, and two channel-like component lead cavities are provided in which the component leads are received, and external lead cavities are provided in which the external leads are positioned.

13. An assembly as set forth in claim 12 characterized in that the component lead cavities and the external lead cavities are parallel and spaced apart, the second cavity means comprising side by side connecting device cavities which extend normally of the component lead cavities.

14. An assembly as set forth in claim 13 characterized in that each of the connecting devices comprises a web having parallel side edges, spaced apart ears are provided which extend normally from the side edges, the lead receiving slots extending into the ears, the component lead cavities and the external lead cavities having laterally extending recesses, the ears being received in the recesses.

15. An assembly as set forth in claim 14 characterized in that a plurality of components are contained in the housing, the first cavity means comprising a plurality of component cavities, each component cavity having two component lead cavities extending therefrom, the component leads and the external leads being parallel to each other, each of the connecting devices having at least one ear for one of the component leads of each component and at least one ear for one of the external leads.

16. A method of making a housing means which contains at least one electrical component, the housing means comprising a hard rigid insulating housing which contains the component, soft insulating shock absorbing material within the housing in surrounding relationship to the component and between the component and the housing, the housing being contained in, and surrounded by, soft insulating shock absorbing material, the method comprising the steps of:

providing the housing in two sections which can be assembled to each other, at least one of the sections having a component-receiving cavity therein and having a passageway which extends from surface portions of the housing to the cavity, placing the component in the cavity and thereafter assembling the housing sections to each other, overmolding the soft insulating shock absorbing material onto the assembled housing and simultaneously causing the soft insulating shock-absorbing material to flow through the passageway and into the cavity whereby, the component is surrounded by, and contained in, the soft insulating shock absorbing material in the cavity and the housing is surrounded by and contained in, the overmolded soft insulating shock-absorbing material.

17. A method as set forth in claim 16 characterized in that the soft insulating shock-absorbing material is overmolded on the housing by an insert molding process in which the housing is placed in a mold cavity and the soft insulating shock-absorbing material is injected into the mold cavity.

18. A method as set forth in claim 17 in which at least two external leads extend into the housing means and into the housing and the component has component leads which are connected to the external leads, the method being characterized in that the component leads are connected to the external leads by placing a sheet metal connecting device having wire-receiving slots in one of the housing sections and placing the component and the external leads in the other section whereby upon assembling the housing sections to each other, the external leads and the component leads will move relatively into the slots and thereby be connected to each other.

* * * * *